US012777936B2

(12) United States Patent
Kim et al.

(10) Patent No.: US 12,777,936 B2
(45) Date of Patent: Oct. 27, 2026

(54) STACK PACKAGE INCLUDING INSERT DIE FOR REINFORCEMENT

(71) Applicant: SK hynix Inc., Icheon-si (KR)

(72) Inventors: Jin Woong Kim, Icheon-si (KR); Jong Yeon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 609 days.

(21) Appl. No.: 18/186,274

(22) Filed: Mar. 20, 2023

(65) Prior Publication Data

US 2024/0120292 A1 Apr. 11, 2024

(30) Foreign Application Priority Data

Oct. 5, 2022 (KR) ........................ 10-2022-0127437

(51) Int. Cl.

| | |
|---|---|
| ***H01L 23/48*** | (2006.01) |
| ***H01L 23/52*** | (2006.01) |
| ***H01L 29/40*** | (2006.01) |
| ***H10W 20/20*** | (2026.01) |
| ***H10W 42/00*** | (2026.01) |
| *H10W 90/00* | (2026.01) |

(52) U.S. Cl.

CPC ......... *H10W 42/121* (2026.01); *H10W 20/20* (2026.01); *H10W 90/792* (2026.01)

(58) Field of Classification Search

CPC ..... H01L 23/562; H01L 23/481; H01L 24/08; H01L 2224/08145; H01L 25/0657; H01L 2224/32145; H01L 25/0652; H01L 2224/16227; H01L 2225/06513; H01L 25/105; H01L 23/12; H01L 2225/1023; H01L 25/0655; H01L 2224/16; H01L 2225/0652; H01L 2225/06555; H01L 24/06; H01L 2224/49175; H01L 25/072; H01L 25/0756; H01L 25/071; H01L 2224/08; H01L 2224/08146; H01L 2225/06503; H01L 2224/05548; H01L 2224/0812; H01L 2224/1411; H01L 2224/13024; H01L 2224/48145

See application file for complete search history.

(56) References Cited

U.S. PATENT DOCUMENTS

| | | | | |
|---|---|---|---|---|
| 6,563,205 | B1 * | 5/2003 | Fogal | H10W 90/00 257/777 |
| 8,598,698 | B1 | 12/2013 | Lim | |
| 12,166,010 | B2 * | 12/2024 | Song | H10W 20/0234 |
| 2011/0037158 | A1 * | 2/2011 | Youn | H10W 72/00 257/692 |
| 2017/0062383 | A1 * | 3/2017 | Yee | H10W 20/057 |
| 2020/0135699 | A1 * | 4/2020 | Hwang | H10W 20/023 |
| 2020/0411483 | A1 | 12/2020 | Uzoh et al. | |
| 2021/0167113 | A1 | 6/2021 | Ryoki et al. | |
| 2021/0391322 | A1 | 12/2021 | Chen et al. | |

FOREIGN PATENT DOCUMENTS

| | | | | |
|---|---|---|---|---|
| KR | 101781799 B1 * | 9/2017 | | H10W 42/121 |
| KR | 1020220014364 A | 2/2022 | | |
| TW | 202123394 A * | 6/2021 | | H01L 21/4853 |

* cited by examiner

*Primary Examiner* — Niki H Nguyen

(74) *Attorney, Agent, or Firm* — WILLIAM PARK AND ASSOCIATES LTD.

(57) ABSTRACT

A stack package includes a first die stack including first dies, a second die stack including second dies, and an insert die between the first die stack and the second die stack, wherein the insert die is thicker than each of the first and second dies.

11 Claims, 7 Drawing Sheets

STACK PACKAGE INCLUDING INSERT DIE FOR REINFORCEMENT

CROSS-REFERENCE TO RELATED APPLICATION

The present application claims priority under 35 U.S.C. § 119(a) to Korean application number 10-2022-0127437, filed in the Korean Intellectual Property Office on Oct. 5, 2022, the entire disclosure of which is incorporated herein by reference.

BACKGROUND

The present disclosure relates to a semiconductor technology and, particularly, to a stack package including an insert die for reinforcement for reinforcing a die stack.

As a semiconductor package has higher performance, becomes more highly integrated, has a higher speed, and is reduced in size, a stack package structure in which semiconductor dies are stacked in a three-dimensional (3-D) form is attempted. A structure in which dies are perpendicularly stacked like a high bandwidth memory module is attempted. For the stack package to have more dies, the dies need to have smaller thicknesses. As the thicknesses of the dies are reduced, a structural failure may be caused in the stacked dies. As the thicknesses of the dies are reduced, warpage may be caused in the dies. The warpage of the dies may cause a bonding failure, such as delamination in which bonding between the dies is broken.

SUMMARY

In an embodiment, a stack package may include: a first die stack including first dies; a second die stack including second dies; and an insert die between the first die stack and the second die stack, the insert die being thicker than each of the first and second dies.

In an embodiment, a stack package may include: a first die stack including first dies; a second die stack including second dies; an insert die between the first die stack and the second die stack, the insert die including first and second bonding surfaces that are opposite to each other; and a third dummy metal layer disposed over the first bonding surface or under the second bonding surface of the insert die.

DETAILED DESCRIPTION

Figure 1:
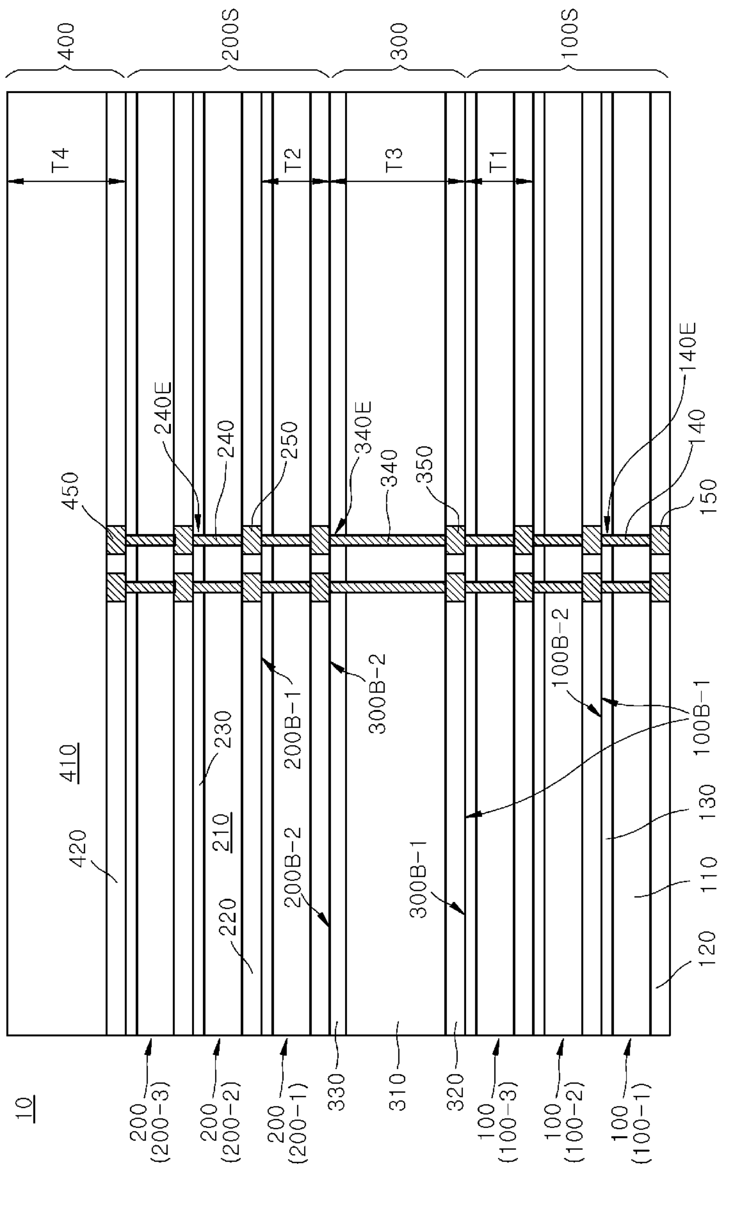
FIG. 1 is a cross-sectional view illustrating a stack package according to an embodiment.

Terms that are used in the description of examples of this application are terms selected by taking into consideration functions in proposed embodiments, and the meanings of the terms may be different depending on a user, an operator's intention, or practice in the technical field. The meaning of a term used follows the definition of the term if the term has been specifically defined in this specification, and may be interpreted as a meaning which may be commonly recognized by those skilled in the art if the term has not been specifically defined.

In the description of examples of this application, terms, such as a "first", a "second", a "side", a "top", and a "bottom or lower", are used to distinguish between members and are not used to limit the members themselves or to mean a specific order.

A semiconductor substrate may denote a semiconductor wafer on which electronic parts and elements are integrated. Integrated circuits may be integrated on the semiconductor substrate. The semiconductor substrate may be diced into a plurality of semiconductor chips or a plurality of semiconductor dies.

The semiconductor chip may be a memory chip on which memory devices, such as DRAM, SRAM, NAND flash memory, NOR flash memory, MRAM, ReRAM, FeRAM, or PcRAM, have been integrated. The semiconductor chip may denote a logic die or an ASIC chip, an application processor (AP), a graphic processing unit (GPU), a central processing unit (CPU), or a system on chip (SoC) in which logic circuits have been integrated on a semiconductor substrate.

The semiconductor chip may be a component that constitutes a semiconductor package or a semiconductor product. The semiconductor chip may be applied to information communication devices such as a mobile terminal, bio or health care-related electronic devices, and electronic devices wearable by human beings. The semiconductor chip may be applied to Internet of Things.

In the entire specification, the same reference numerals may denote the same components. Accordingly, the same reference numerals or similar reference numerals may be described with reference to other drawings although they are not mentioned or described in corresponding drawings. Furthermore, although reference numerals are not shown, they may be described with reference to other drawings.

The present disclosure may present a structure for improved reliability and an increased yield in the semiconductor package or microelectronics technology field. The present disclosure may describe a stack structure of directly bonded dies. A stack structure in which dies are directly bonded together may include a structure in which bonding surfaces of the dies are directly bonded. The bonding surface of the die may denote an exposed surface of the die. The structure in which the dies are directly bonded together may be a bonding structure from which a separate adhesive layer, connecting bump, or soldering layer between the dies has been excluded.

A bonding surface of a die may include a surface part of a dielectric layer and a surface part of a conductive layer, which are included in the die. The die may include a die body, a conductive through via that substantially penetrates the die body, dielectric layers that cover the die body, and a conductive layer, a metal layer, or a connecting pad that is exposed to the dielectric layers. The bonding surface of the die may include a surface part of the dielectric layer, and may include a surface part of the connecting pad or an end part of the through via, which is exposed to the dielectric layer. The direct bonding of the dies may denote a bonding structure or bonding process in which a lower surface part of a lower dielectric layer of a lower die and an upper surface part of an upper dielectric layer of a the top die are bonded together through a covalent bond and a metal layer that constitutes the connecting pads of the dies and a metal layer that constitutes the end of the through via are bonded together. The dielectric layer may include silicon dioxide, and the metal layer, the connecting pad, or the through via may include a copper layer. The direct bonding of the dies may denote copper-$SiO_2$ hybrid bonding.

A stack structure may provide a structure characteristic and stack construction for a memory module or a three-dimensional (3-D) package. A process and structure may include a thicker insert die and dies that are directly bonded together under and over the insert die, for example.

The insert die may act as an element for reinforcement or a stress reduction element for reducing stress, which may be accompanied in dies that are directly bonded to the insert die or between dies that are directly bonded to the insert die. The insert die may reduce the warpage of the dies. The insert die is inserted into a die stack as a middle tier of the die stack. The insert die may reduce the occurrence of delamination between the dies by reducing stress.

The die stack may further include a dummy metal layer between the dies. Tensile stress may occur in the dummy metal layer due to a thermal budget which may be applied to the die stack. The tensile stress of the dummy metal layer may compensate for compressive stress which may occur in stacked dies due to the thermal budget. The dummy metal layer may act as an element that reduces the warpage of the dies by compensating for stress that is accompanied in the stacked dies.

FIG. 1 is a cross-sectional view illustrating a stack package 10 according to an embodiment.

Referring to FIG. 1, the stack package 10 may include a first die stack 100S, a second die stack 200S, and an insert die 300. In the following writing, writing, such as the "first" or the "second", should be understood to distinguish between elements, and should not be understood to denote a specific order or number of elements. The first die stack 100S may include first dies 100, and the second die stack 200S may include second dies 200. The second die stack 200S may be disposed over the first die stack 100S. The insert die 300 may be inserted between the first die stack 100S and the second die stack 200S. The insert die 300 may be directly bonded to the first die stack 100S. The second die stack 200S may be directly bonded to the insert die 300.

The first die stack 100S may include a plurality of first dies 100 that are perpendicularly stacked. The first die stack 100S has been illustrated as a stack including the first dies 100 that are stacked in three layers in FIG. 1, but may further include more first dies 100. The first die 100 may include a first die body 110 and first and second dielectric layers 120 and 130 that cover surfaces of the first die body 110. The first dielectric layer 120 and the second dielectric layer 130 may be formed to cover opposite surfaces of the first die body 110, respectively. The dielectric layers 120 and 130 may be formed to include silicon dioxide ($SiO_2$) layers. The first die 100 may further include conductive first through vias 140 as a connector that substantially penetrates the first die body 110. The first through vias 140 may be formed in the form of a through silicon via (TSV) structure.

The first die body 110 may include a semiconductor substrate in which integrated circuit elements are integrated. The integrated circuit elements may include a volatile memory device, such as a dynamic random-access memory (DRAM) device, or a nonvolatile memory device, such as a NAND flash memory device. The semiconductor substrate may be a substrate that includes silicon (Si) or germanium (Ge) or may be a substrate that includes silicon carbide (SiC), gallium arsenide (GaAs), indium arsenide (InAs), or indium phosphorous (InP). Although not illustrated, the first through vias 140 may be electrically connected to the integrated circuit elements that are formed in the first die body 110.

The first dies 100 may further include first connecting pads 150 that are electrically connected or bonded to the first through vias 140. The first connecting pads 150 may be formed to include a conductive layer or to include a metal layer. The first connecting pads 150 may be formed to include a material that constitutes the first through vias 140. The first through vias 140 may be formed to include a copper (Cu) layer. The first connecting pads 150 may also be formed to include a Cu layer. The first connecting pad 150 may be directly connected to the first through via 140 or may be formed to be connected to the first through via 140 through other traces with the traces interposed between the first connecting pad 150 and the first through via 140. The first dielectric layer 120 may be formed to expose a surface part of the first connecting pad 150 while covering a surface of the first die body 110. The second dielectric layer 130 may be formed to expose an end (140E) part of the first through via 140 while covering a surface of the first die body 110 on the side opposite to the side of the covered surface of the first die body 110.

The first die stack 100S may include the first dies 100 in which bonding surfaces 100B-1 and 100B-2 that face each other are directly bonded together. The first dies 100 may have a third bonding surface 100B-1 and a fifth bonding surface 100B-2, that is, surfaces that are opposite to each other. In the following writing, writing, such as the "third" or the "fifth", should be understood to distinguish between elements, and should be understood to not denote a specific order or number of elements. The first dies 100 may be perpendicularly stacked so that the other fifth bonding surface 100B-2 is directly bonded to one third bonding surface 100B-1. For example, a first die 100-2 of a second layer may be stacked on a first die 100-1 of a first layer so that the fifth bonding surface 100B-2 of the first die 100-2 of the second layer is directly bonded to the third bonding surface 100B-1 of the first die 100-1 of the first layer.

The third bonding surface 100B-1 of the first die 100 may be a surface including an exposed surface part of the second dielectric layer 130 of the first die 100 and an exposed end (140E) part of the first through via 140 of the first die 100. The fifth bonding surface 100B-2 of the first die 100 may be a surface including an exposed surface part of the first dielectric layer 120 of the first die 100 and an exposed surface part of the first connecting pad 150 of the first die 100. In the same manner, the plurality of first dies 100 may be perpendicularly stacked to constitute the first die stack 100S.

The insert die 300 may be further stacked on the stacked first dies 100 that constitute the first die stack 100S. The insert die 300 may be a die thicker than the first die 100 that is disposed under the insert die 30. A thickness T3 of the insert die 300 may be thicker than a thickness T1 of the first die 100 that is disposed under the insert die 300, so that the insert die 300 may have greater stiffness (or hardness) than the first die 100. The insert die 300 may have greater resistance than the first die 100 with respect to warpage. The insert die 300 may have the thickness T3 that is 1.5 times to 10 times greater or more than the thickness T1 of the first die 100. For example, if the first die 100 has a thickness of several tens of nanometers (nm), the insert die 300 may have a thickness of several tens of nanometers to several hundreds of nanometers (nm). If the first die 100 has a thickness of 10 nm to 30 nm, the insert die 300 may have a thickness 60 nm to 700 nm. If the first die 100 has a thickness of about 20 nm, the insert die 300 may have a thickness of 100 nm to 200 nm.

The insert die 300 may be a die thicker than the second die 200 that is disposed over the insert die 300. The thickness T3 of the insert die 300 may be thicker than a thickness T2 of the second die 200 that is disposed over the insert die 300. The second die 200 may have the thickness T2 that is substantially the same as or similar to the thickness T1 of the first die 100. Because the insert die 300 may have a thicker thickness than each of the first and second dies 100 and 200 as described above, the insert die 300 can reduce stress which may be accompanied in the dies 100 and 200 that are directly bonded to the insert die 300 or between the dies 100 and 200 that are directly bonded to the insert die 300 or can resist a bending force. The insert die 300 may act as an element for reinforcement or stress reduction element, for reinforcing the stacks 100S and 200S of the dies 100 and 200.

The insert die 300 has been illustrated as being inserted between the first die stack 100S and the second die stack 200S as one entity in FIG. 1, but a plurality of insert dies 300 may be inserted between the first die stack 100S and the second die stack 200S in a form in which the insert dies 300 have been perpendicularly stacked.

The insert die 300 may include an insert die body 310 and dielectric layers 320 and 330 that cover surfaces of the insert die body 310. A third dielectric layer 320 and a fourth dielectric layer 330 may be formed to cover opposite surfaces of the insert die body 310, respectively. The dielectric layers 320 and 330 may be formed to include silicon dioxide ($SiO_2$) layers. The insert die 300 may further include conductive second through vias 340 as connecting parts that substantially penetrate the insert die body 310. The second through vias 340 may be formed in the form of a TSV structure.

The insert die body 310 may include another semiconductor substrate in which integrated circuit elements are integrated like the first die body 110. The integrated circuit elements that are integrated in the insert die body 310 may include a volatile memory device or a nonvolatile memory device. Although not illustrated, the second through vias 340 may be electrically connected to the integrated circuit elements that are formed in the insert die body 310. Because the insert die 300 may be thicker than the first die 100 that is disposed under the insert die 300, the second through via 340 may be formed to have a longer length than the first through via 140.

The insert die 300 may further include second connecting pads 350 that are electrically connected or bonded to the second through vias 340, respectively. The second connecting pads 350 may be formed to include a conductive layer, such as a metal layer. The second connecting pads 350 may be formed to include a material that constitutes the second through vias 340. The second through vias 340 may be formed to include a copper (Cu) layer. The second connecting pads 350 may also be formed to include a Cu layer. The second connecting pad 350 may be directly connected to the second through via 340 or may be formed to be connected to the second through via 340 through other traces with the other traces interposed between the second connecting pad 350 and the second through via 340. The third dielectric layer 320 may be formed to expose a surface part of the second connecting pad 350 while covering a surface of the insert die body 310. The fourth dielectric layer 330 may be formed to expose an end part 340E of the second through via 340 while covering a surface of the insert die body 310 on the side opposite to the side of the covered surface of the insert die body 310.

The insert die 300 may include bonding surfaces 300B-1 and 300B-2 that face each other or that are opposite to each other. A first bonding surface 300B-1 of the insert die 300 may be one surface that faces the first die stack 100S under the insert die 300. A second bonding surface 300B-2 of the insert die 300 may be the other surface that faces the second die stack 200S over the insert die 300. The first bonding surface 300B-1 of the insert die 300 may be a surface including an exposed surface part of the third dielectric layer 320 of the insert die 300 and a surface part of the second connecting pad 350 that is exposed to the third dielectric layer 320. The second bonding surface 300B-2 of the insert die 300 may be the other surface including an exposed surface part of the fourth dielectric layer 330 of the insert die 300 and the end part 340E of the second through via 340 that is exposed to the fourth dielectric layer 330.

The insert die 300 may be directly bonded to a first die 100-3 of the highest layer so that the first bonding surface 300B-1 of the insert die 300 is directly bonded to the third bonding surface 100B-1 of the first die 100-3 of the highest layer that is disposed immediately under the insert die 300. The first die 100-3 of the highest layer may denote the first die 100 that is disposed at the highest layer among the first dies 100 that are stacked in the first die stack 100S. Alternatively, the first die 100-3 of the highest layer may denote the first die 100 that is disposed nearest to the insert die 300 among the first dies 100 that are stacked in the first die stack 100S. As the second connecting pad 350 of the insert die 300 is bonded to the end 140E of the first through via 140 of the first die 100-3 of the highest layer, the third dielectric layer 320 of the insert die 300 may be bonded to the second dielectric layer 130 of the first die 100-3 of the highest layer. As the second through via 340 is electrically connected to the first through via 140 through the second connecting pad 350, the insert die 300 may be electrically connected to the first die 100-3 of the highest layer under the insert die 300.

A second die 200-1 of the lowest layer may be stacked on the insert die 300 so that a fourth bonding surface 200B-2 of the second die 200 is directly bonded to the second bonding surface 300B-2 of the insert die 300. The second die 200-1 of the lowest layer may denote the second die 200 that is disposed at the lowest layer among the second dies 200 that are stacked in the second die stack 200S. Alternatively, the second die 200-1 of the lowest layer may denote the second die 200 that is disposed nearest to the insert die 300 among the second dies 200 that are stacked in the second die stack 200S. The second dies 200 may be further stacked on the second die 200-1 of the lowest layer, so that the second die stack 200S is constructed. The stacked second dies 200 may have the fourth bonding surface 200B-2 and a sixth bonding surface 200B-1, that is, surfaces that are opposite to each other. In the following writing, writing, such as the "fourth" or the "sixth", should be understood to distinguish between elements, and should be understood to not denote a specific order or number of elements.

The second dies 200 may be perpendicularly stacked so that the other fourth bonding surface 200B-2 is directly bonded to one sixth bonding surface 200B-1. For example, a second die 200-2 of a middle layer may be stacked on the second die 200-1 of the lowest layer so that the fourth bonding surface 200B-2 of the second die 200-2 of the middle layer is directly bonded to the sixth bonding surface 200B-1 of the second die 200-1 of the lowest layer. Likewise, the second die 200-3 of the highest layer may be stacked on the second die 200-2 of the middle layer. In FIG. 1, three second dies 200 have been illustrated as being stacked in the second die stack 200S, but the second die stack 200S may further include more second dies 200.

The second dies 200 may include a second die body 210 and dielectric layers 220 and 230 that cover surfaces of the second die body 210, respectively. A fifth dielectric layer 220 and a sixth dielectric layer 230 may be formed to cover opposite surfaces of the second die body 210, respectively. The dielectric layers 220 and 230 may be formed to include silicon dioxide ($SiO_2$) layers. Each of the second dies 200 may further include conductive third through vias 240 as connecting parts that substantially penetrate the second die body 210. The third through vias 240 may be formed in the form of a TSV structure.

The second die body 210 may include a semiconductor substrate in which integrated circuit elements are integrated like the first die body 110. The integrated circuit elements that are integrated in the second die body 210 may include a volatile memory device or a nonvolatile memory device. Although not illustrated, the third through vias 240 may be electrically connected to the integrated circuit elements that are formed in the second die body 210. Because the insert die 300 may be thicker than the second die 200 that is disposed over the insert die 300, the third through via 240 may be formed to have a shorter length than the second through via 340.

The second die 200 may further include third connecting pads 250 that are electrically connected or bonded to the third through vias 240. The third connecting pads 250 may be formed to include a conductive layer or to include a metal layer. The third connecting pads 250 may be formed to include a material that constitutes the third through vias 240. The third through vias 240 may be formed to include a copper (Cu) layer. The third connecting pads 250 may also be formed to include a copper layer. The third connecting pad 250 may be directly connected to the third through via 240 or may be formed to be connected to the third through via 240 through other traces with the other traces interposed between the third connecting pad 250 and the third through via 240. The fifth dielectric layer 220 may be formed to expose a surface part of the third connecting pad 250 while covering a surface of the second die body 210. The sixth dielectric layer 230 may be formed to expose an end part 240E of the third through via 240 while covering a surface of the second die body 210 on the side opposite to the side of the covered surface of the second die body 210.

The fourth bonding surface 200B-2 of the second die 200 may be a surface including an exposed surface part of the fifth dielectric layer 220 of the second die 200 and a surface part of the third connecting pad 250 that is exposed to the fifth dielectric layer 220. The sixth bonding surface 200B-1 of the second die 200 may be a surface including an exposed surface part of the sixth dielectric layer 230 of the second die 200 and the end (240E) part of the third through via 240 that is exposed to the sixth dielectric layer 230.

The second die 200-1 of the lowest layer that is disposed at the lowest layer, among the stacked second dies 200, is disposed to directly face the insert die 300. The fourth bonding surface 200B-2 of the second die 200-1 of the lowest layer may be directly bonded to the second bonding surface 300B-2 of the insert die 300 disposed under the fourth bonding surface 200B-2. As the third connecting pad 250 of the second die 200-1 of the lowest layer is bonded to the end part 340E of the second through via 340 of the insert die 300, the fourth dielectric layer 330 of the insert die 300 may be bonded to the fifth dielectric layer 220 of the second die 200-1 of the lowest layer. As the third through via 240 of the second die 200-1 of the lowest layer is electrically connected to the second through via 340 of the insert die 300 through the third connecting pad 250, the insert die 300 may be electrically connected to the second die 200-1 of the lowest layer over the insert die 300. The second through via 340 of the insert die 300 may electrically connect the third through via 240 of the second die 200-1 of the lowest layer over the insert die 300 and the first through vias 140 of the first die 100 under the insert die 300 perpendicularly. The second through via 340 of the insert die 300 may electrically connect the first through vias 140 of the stacked first dies 100 to the third through vias 240 of the stacked second dies 200.

Because the insert die 300 has the thickness T3 thicker than the thickness of each of the stacked first dies 100 and thus has relatively greater resistance to warpage, the second bonding surface 300B-2 of the insert die 300 may have a substantially flat surface state. Because the second bonding surface 300B-2 of the insert die 300 has a flat state, the cause of a bonding failure between the second dies 200 when the second dies 200 are sequentially stacked on the insert die 300 can be reduced. Because the insert die 300 has not been bent, the second die 200 may be bonded on the insert die 300 without an accompanying bonding failure.

Referring back to FIG. 1, the stack package 10 may further include a top die 400 that is bonded to the second die stack 200S. The top die 400 may be a die that is thicker than each of the stacked second dies 200 that are disposed under the top die 400. A thickness T4 of the top die 400 may be thicker than the thickness T2 of the second die 200 that is disposed under the top die 400, so that the top die 400 may have greater stiffness (or hardness) than the second die 200. The top die 400 may have greater resistance than the second die 200 with respect to warpage.

The top die 400 may have the thickness T4 that is 1.5 times to 10 times greater or more than the thickness T2 of the second die 200. The second die 200 may have the thickness T2 that is similar to or substantially the same as the thickness of the first die 100. The top die 400 may have the thickness T4 thicker than the thickness of the stacked first die 100. The top die 400 may have a thickness of several tens of nanometers (nm) to several hundreds of nanometers (nm). The top die 400 may have a thickness of 200 nm to 700 nm in some embodiments. As the top die 400 has a thicker thickness than each of the first and second dies 100 and 200, the top die 400 can reduce stress which may be accompanied in the dies 100 and 200 that are directly bonded to the top die 400 or between the dies 100, 200 that are directly bonded to the top die 400 or can resist a bending force. The top die 400 may act as an element for reinforcement or a stress reduction element, for reinforcing the stacks 100S and 200S of the dies 100 and 200 like the insert die 300.

The top die 400 has been illustrated as being stacked on the second die stack 200S as one entity in FIG. 1, but a plurality of top dies 400 may be stacked on the second die stack 200S in a form in which the top dies 400 have been perpendicularly stacked.

The top die 400 may include a top die body 410 and a seventh dielectric layer 420 that covers a surface of the top die body 410 on one side of the top die body 410. Writing, such as the "seventh", should be understood to distinguish between elements, and should be understood to not denote a specific order or number of elements. The seventh dielectric layer 420 may be formed to include a silicon dioxide ($SiO_2$) layer). The top die body 410 may include a semiconductor substrate in which integrated circuit elements are integrated. The integrated circuit elements may include a volatile memory device or a nonvolatile memory device. The top die 400 may further include fourth connecting pads 450 electrically connected to the integrated circuit elements that are integrated in the top die body 410. The seventh dielectric layer 420 may be bonded to the sixth dielectric layer 230 of the second die 200-3 of the highest layer that is disposed under the seventh dielectric layer 420, and may be formed to expose a surface of the fourth connecting pad 450. The top die 400 may be directly bonded to the second die 200-3 of the highest layer that is disposed under the top die 400, and may be stacked in the second die 200-3 of the highest layer.

Although not illustrated in FIG. 1, the stack package 10 may further include an encapsulant layer that protects the stack structure including the first die stack 100S, the insert die 300, the second die stack 200S, and the top die 400. The stack package 10 may further include an interconnection component (not illustrated) in which the stack structure including the first die stack 100S, the insert die 300, the second die stack 200S, and the top die 400 is disposed. The interconnection component may include a printed circuit board (PCB) or an interposer.

Figure 2:
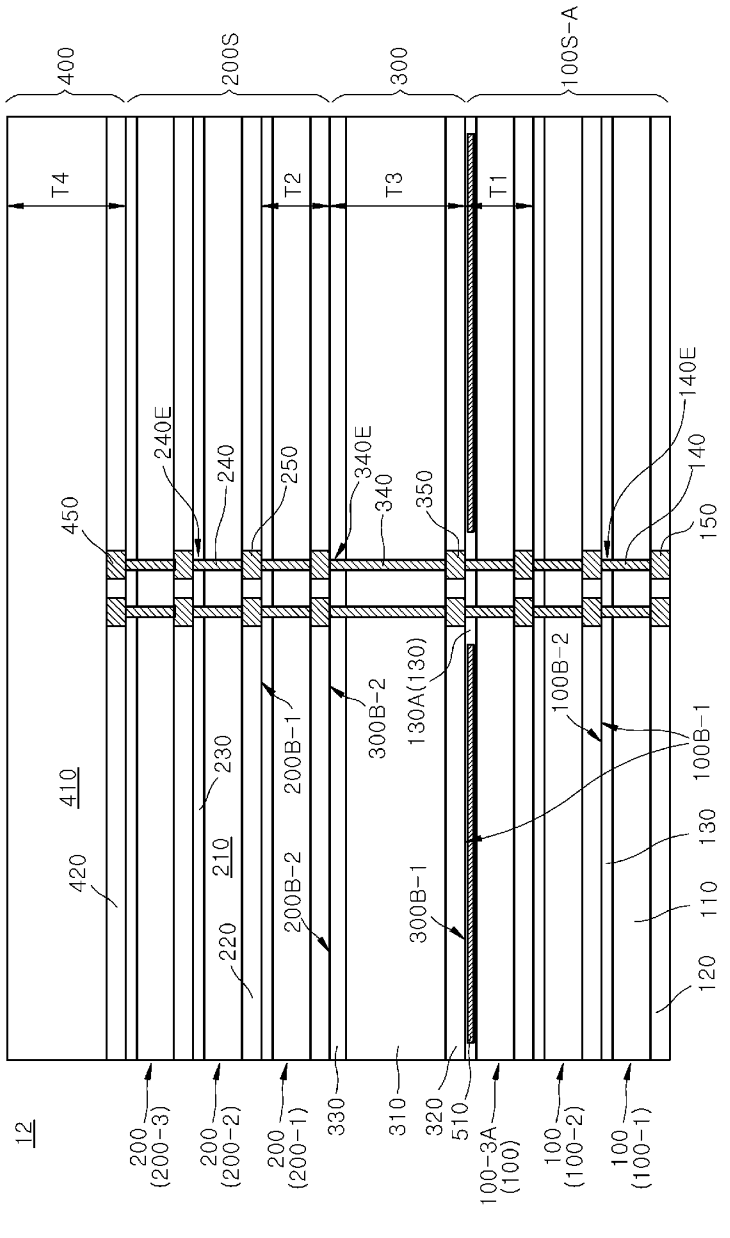
FIG. 2 is a cross-sectional view illustrating a stack package according to an embodiment.
Figure 3:
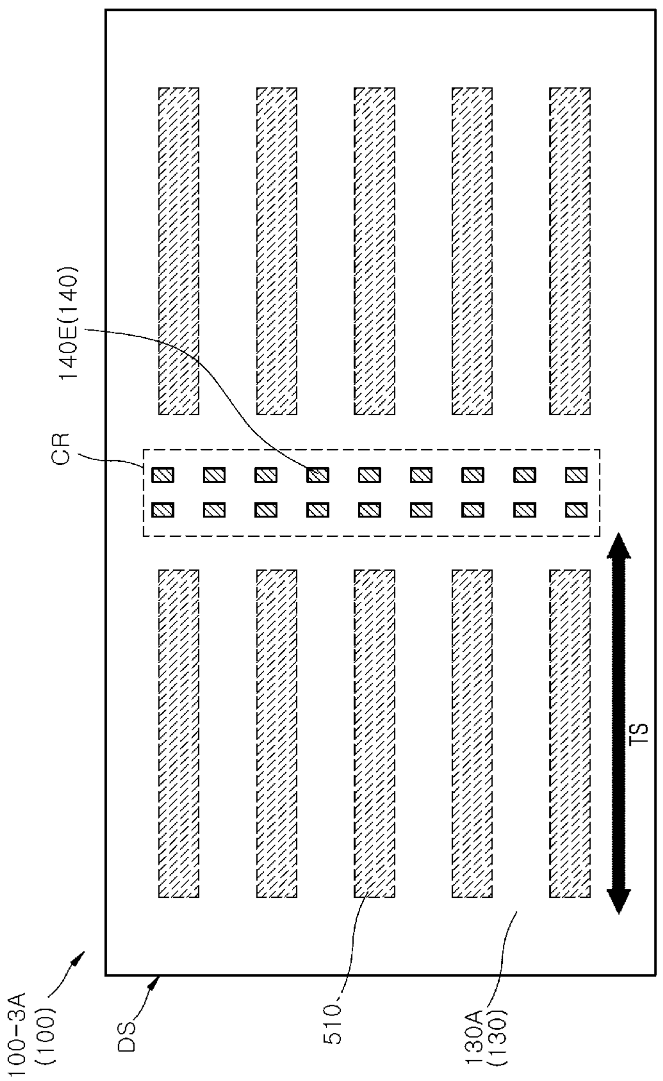
FIG. 3 is a plan view illustrating a dummy metal layer of the stack package in FIG. 2.

FIG. 2 is a cross-sectional view illustrating a stack package 12 according to an embodiment. FIG. 3 is a plan view illustrating a first dummy metal layer 510 of the stack package 12 in FIG. 2. In FIG. 2, elements that are presented to have the same reference numerals, that are described as having substantially the same shapes, or that are described as having substantially similar shapes as those in FIG. 1 may be understood to teach the same elements.

Referring to FIG. 2, the stack package 12 may further include the first dummy metal layer 510 between a first die stack 100S-A and the insert die 300. The first dummy metal layer 510 may be formed in a first die 100-3A that is disposed at the highest layer among the first dies 100 included in the first die stack 100S-A. The first dummy metal layer 510 may be formed to be disposed under the third bonding surface 100B-1 of the first die 100-3A that is disposed at the highest layer of the first die stack 100S-A. The first dummy metal layer 510 may be formed to have a pattern shape that is electrically isolated by the second dielectric layer 130A of the first die 100-3A that is disposed at the highest layer of the first die stack 100S-A. The second dielectric layer 130A of the first die 100-3A that is disposed at the highest layer may be formed to isolate the first dummy metal layer 510 from the outside by covering the first dummy metal layer 510.

Referring to FIGS. 2 and 3, the first dummy metal layer 510 may be formed to include a plurality of stripe shapes. The first dummy metal layer 510 may be formed in a stripe shape that is extended from a center region (CR) in which the first through vias 140 have been formed to a die side (DS). The first dummy metal layer 510 may generate tensile stress TS by a thermal budget which may be applied to the first die stack 100S-A or the stack package 12. Such tensile stress may act as resistance against the bending of the first die stack 100S-A by reducing a force by which the first die stack 100S-A is bent. The first dummy metal layer 510 may play a role to reduce the bending of the first die stack 100S-A.

Figure 4:
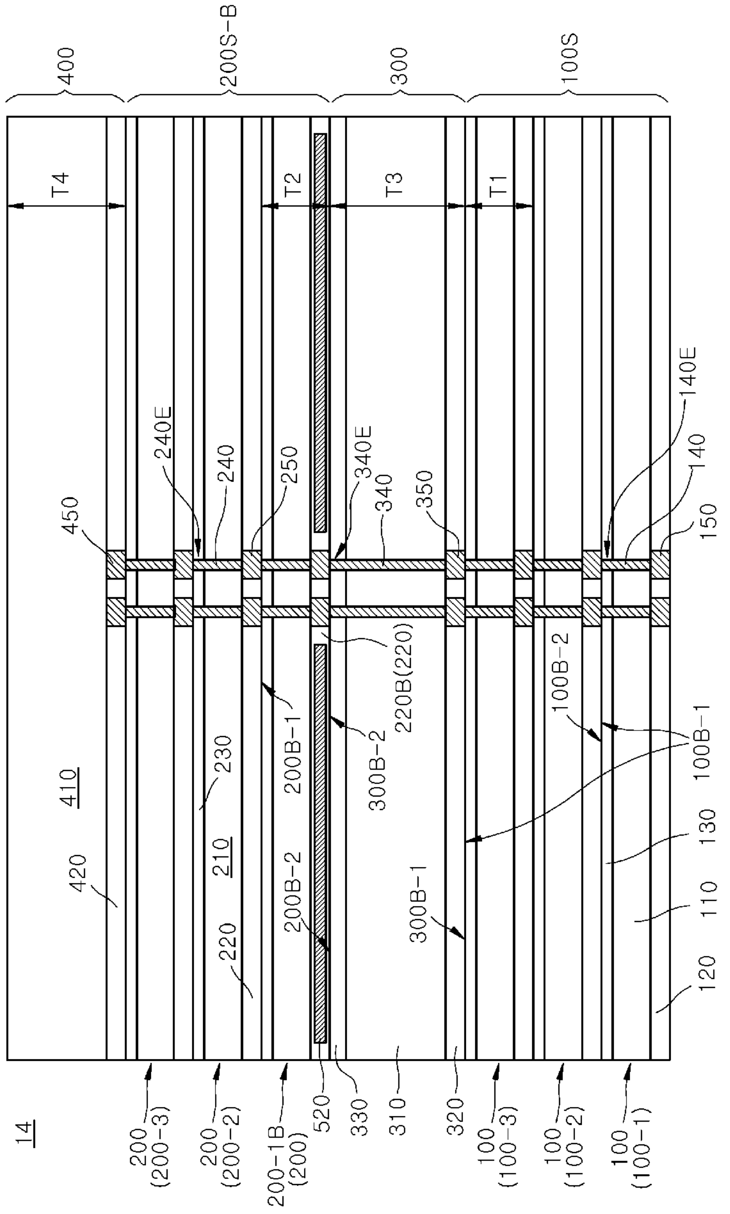
FIG. 4 is a cross-sectional view illustrating a stack package according to an embodiment.

FIG. 4 is a cross-sectional view illustrating a stack package 14 according to an embodiment. In FIG. 4, elements that are presented to have the same reference numerals, that are described as having substantially the same shapes, or that are described as having substantially similar shapes as those in FIG. 1 may be understood to teach the same elements.

Referring to FIG. 4, the stack package 14 may further include a second dummy metal layer 520 that is introduced between a second die stack 200S-B and the insert die 300. The second dummy metal layer 520 may be formed in a second die 200-1B that is disposed at the lowest layer among the second dies 200 included in the second die stack 200S-B. The second dummy metal layer 520 may be formed to be disposed on the fourth bonding surface 200B-2 of the second die 200-1B that is disposed at the lowest layer of the second die stack 200S-B. The second dummy metal layer 520 may be formed to have a pattern shape that is electrically isolated by the fifth dielectric layer 220B of the second die 200-1B that is disposed at the lowest layer of the second die stack 200S-B. The fifth dielectric layer 220B of the second die 200-1B disposed at the lowest layer may be formed to isolate the second dummy metal layer 520 from the outside by covering the second dummy metal layer 520.

The second dummy metal layer 520 may be formed to have a pattern shape similar to that of the first dummy metal layer (510 in FIG. 3). The second dummy metal layer 520 may be formed to include a plurality of stripe shapes. The second dummy metal layer 520 may generate tensile stress like the first dummy metal layer 510 due to a thermal budget which may be applied to the second die stack 200S-B or the stack package 14. Such tensile stress may act as resistance against the bending of the second die stack 200S-B by reducing a force by which the second die stack 200S-B is bent. The second dummy metal layer 520 may play a role to reduce the bending of the second die stack 200S-B.

Figure 5:
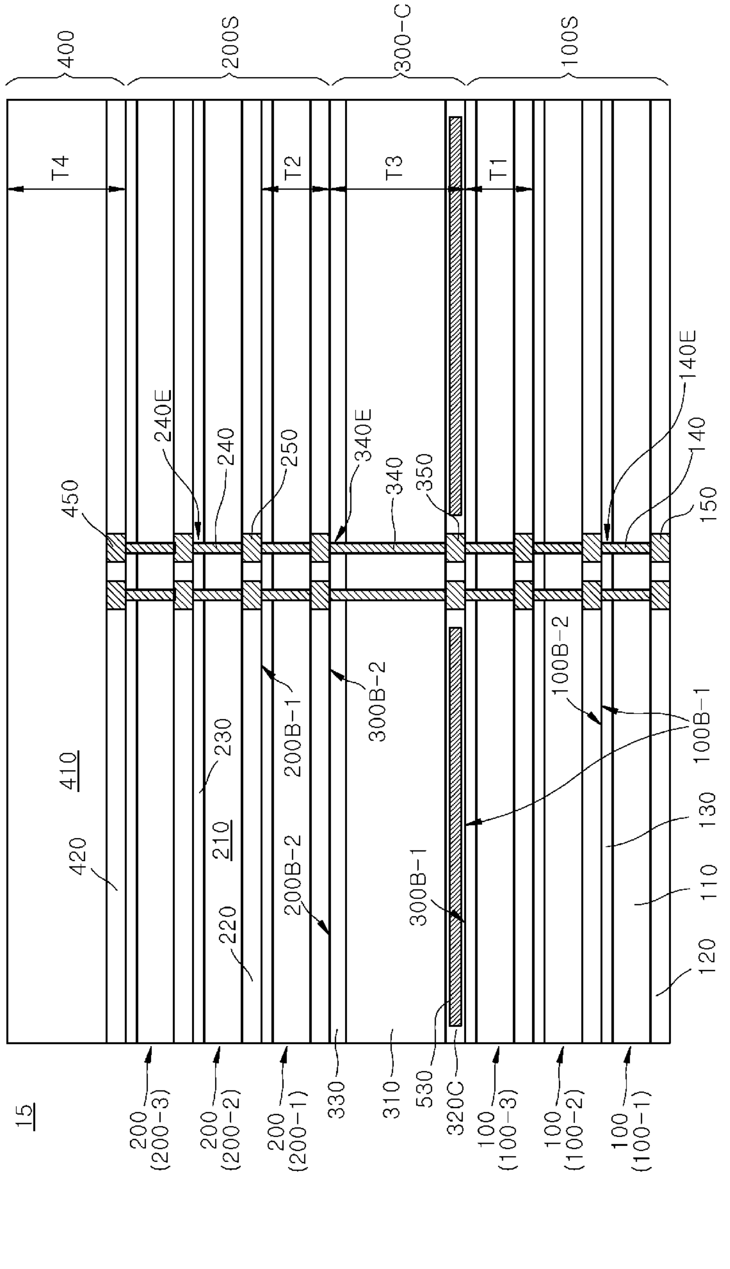
FIG. 5 is a cross-sectional view illustrating a stack package according to an embodiment.

FIG. 5 is a cross-sectional view illustrating a stack package 15 according to an embodiment. In FIG. 5, elements that are presented to have the same reference numerals, that are described as having substantially the same shapes, or that are described as having substantially similar shapes as those in FIG. 1 may be understood to teach the same elements.

Referring to FIG. 5, the stack package 15 may further include a third dummy metal layer 530 between the first die stack 100S and an insert die 300-C. Writing, such as the "first, second, and third dummy metal layers" described so far, should be understood to distinguish between the dummy metal layers, and should not be interpreted to denote a specific order or number of dummy metal layers.

The third dummy metal layer 530 may be formed at a location that faces the first die 100-3 that is disposed at the highest layer among the first dies 100 included in the first die stack 100S. The third dummy metal layer 530 may be formed on the first bonding surface 300B-1 of the insert die 300-C. The third dummy metal layer 530 may be formed on the third bonding surface 100B-1 of the first die 100-3 that is disposed at the highest layer of the first die stack 100S. The third dummy metal layer 530 may be formed to have a pattern shape that is electrically isolated by a third dielectric layer 320C of the insert die 300-C. The third dielectric layer 320C of the insert die 300-C may be formed to isolate the third dummy metal layer 530 from the outside by covering the third dummy metal layer 530. The third dummy metal layer 530 may be formed to include a plurality of stripe shapes like the first dummy metal layer 510 in FIG. 3.

The third dummy metal layer 530 may generate tensile stress due to a thermal budget which may be applied to the first die stack 100S or the stack package 15. Such tensile stress may act as resistance against the bending of the first die stack 100S by reducing a force by which the first die stack 100S is bent. The third dummy metal layer 530 may play a role to reduce the bending of the first die stack 100S.

Figure 6:
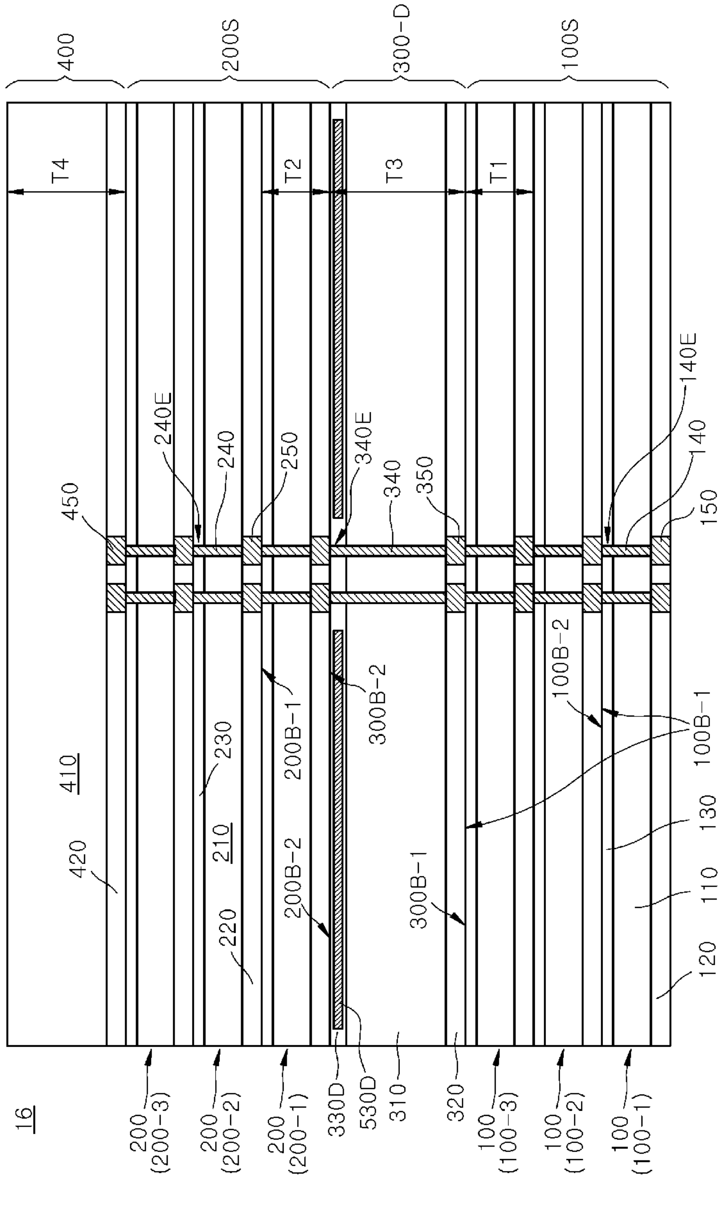
FIG. 6 is a cross-sectional view illustrating a stack package according to an embodiment.

FIG. 6 is a cross-sectional view illustrating a stack package 16 according to an embodiment. In FIG. 6, elements that are presented to have the same reference numerals, that are described as having substantially the same shapes, or that are described as having substantially similar shapes as those in FIG. 1 may be understood to teach the same elements.

Referring to FIG. 6, the stack package 16 may further include a fourth dummy metal layer 530D between the second die stack 200S and an insert die 300-D. The fourth dummy metal layer 530D may be an element that is similar to or substantially the same as the third dummy metal layer 530 in FIG. 5. The fourth dummy metal layer 530D may be disposed at a location that faces the second die 200-1 that is disposed at the lowest layer among the second dies 200 included in the second die stack 200S. The fourth dummy metal layer 530D may be formed under the second bonding surface 300B-2 of the insert die 300-D. The fourth dummy metal layer 530D may be formed under the fourth bonding surface 200B-2 of the second die 200-1 that is disposed at the lowest layer of the second die stack 200S. The fourth dummy metal layer 530D may be formed to have a pattern shape that is electrically isolated by a fourth dielectric layer 330D of the insert die 300-D. The fourth dielectric layer 330D of the insert die 300-D may be formed to isolate the fourth dummy metal layer 530D from the outside by covering the fourth dummy metal layer 530D. The fourth dummy metal layer 530D may be formed to include a plurality of stripe shapes like the first dummy metal layer 510 in FIG. 3.

The fourth dummy metal layer 530D may generate tensile stress due to a thermal budget which may be applied to the first die stack 100S, the second die stack 200S, or the stack package 16. Such tensile stress may act as resistance against the bending of the first die stack 100S and the second die stack 200S by reducing a force by which the first die stack 100S and the second die stack 200S are bent. The fourth dummy metal layer 530D may play a role to reduce the bending of the first die stack 100S and the second die stack 200S.

The third dummy metal layer 530 in FIG. 5 may be further included in the insert die 300-D so that the third dummy metal layer 530 corresponds to the fourth dummy metal layer 530D in FIG. 6. The first dummy metal layer 510 in FIG. 2 may be further included in the stack package 16 in FIG. 6. The second dummy metal layer 520 in FIG. 4 may be further included in the stack package 16 in FIG. 6.

Figure 7:
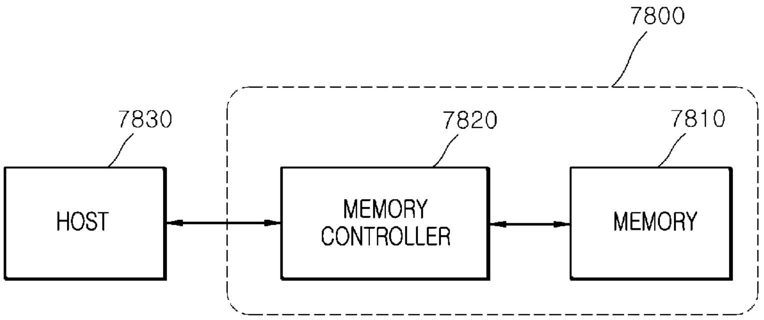
FIG. 7 is a block diagram illustrating an electronic system using a memory card including a stack package according to an embodiment.

FIG. 7 is a block diagram illustrating an electronic system including a memory card 7800 employing at least one stack packages according to an embodiment of the present disclosure. The memory card 7800 includes a memory device 7810 such as a nonvolatile memory device, and a memory controller 7820. The memory device 7810 and the memory controller 7820 may store data or read out the stored data. At least one of the memory device 7810 and the memory controller 7820 may include at least one of the semiconductor packages according to the embodiments.

The memory device 7810 may be a nonvolatile memory device to which the technology of the embodiments of the present disclosure is applied. The memory controller 7820 may control the memory device 7810 such that stored data is read out or data is stored in response to a read/write request from a host 7830.

Figure 8:
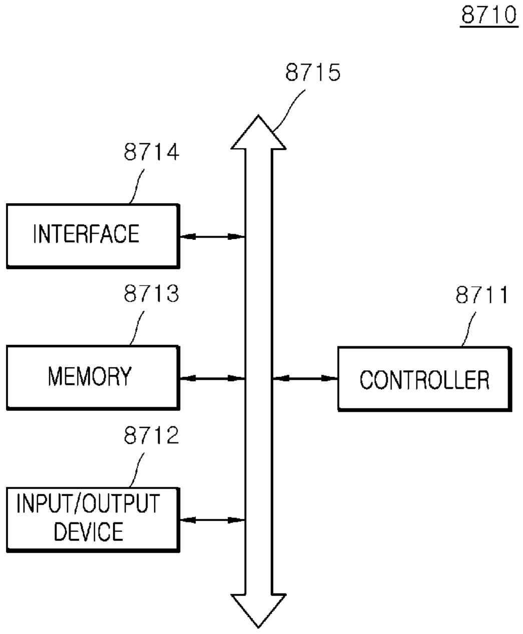
FIG. 8 is a block diagram illustrating an electronic system including a stack package according to an embodiment.

FIG. 8 is a block diagram illustrating an electronic system 8710 including at least one stack package according to an embodiment of the present disclosure. The electronic system 8710 may include a controller 8711, an input/output device 8712, and a memory device 8713. The controller 8711, the input/output device 8712, and the memory device 8713 may be coupled with one another through a bus 8715 providing a path through which data moves.

In an embodiment, the controller 8711 may include one or more microprocessor, digital signal processor, microcontroller, and/or logic device capable of performing the same functions as these components. The controller 8711 or the memory device 8713 may include at least one semiconductor package according to an embodiment of the present disclosure. The input/output device 8712 may include at least one selected among a keypad, a keyboard, a display device, a touch screen, and so forth. The memory device 8713 is a device for storing data. The memory device 8713 may store data and/or commands to be executed by the controller 8711, and the like.

The memory device 8713 may be a volatile memory device such as a DRAM device and/or a nonvolatile memory device such as a flash memory device. For example, a flash memory device may be mounted to an information processing system such as a mobile terminal or a desktop computer. The flash memory device may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of code division multiple access (CDMA), global system for mobile communications (GSM), north American digital cellular (NADC), enhanced-time division multiple access (E-TDMA), wideband code division multiple access (WCDMA), CDMA2000, long term evolution (LTE), or wireless broadband Internet (WiBro).

The embodiments of the present disclosure have been described so far. A person having ordinary knowledge in the art to which the present teachings pertain will understand that the present teachings may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A stack package comprising:

a first die stack including first dies each of the first dies including first through vias, wherein the first dies are vertically stacked and directly bonded to each other;

a second die stack disposed over the first die stack and including second dies each of the second dies including third through vias, wherein the second dies are vertically stacked and directly bonded to each other; and an insert die between the first die stack and the second die stack, the insert die being thicker than each of the first and second dies, wherein the insert die includes first and second bonding surfaces opposite to each other and second through vias configured to electrically connect the first through vias to the second dies, wherein the first bonding surface of the insert die is directly bonded to a third bonding surface of an uppermost first die among of the first dies, and wherein the second bonding surface of the insert die is directly bonded to a fourth bonding surface of a lowermost second die among of the second dies.

2. The stack package of claim 1, further comprising a top die that is bonded to the second die stack, the top die being thicker than each of the second dies.

3. The stack package of claim 1, wherein each of the second through vias is longer than each of the first through vias.

4. The stack package of claim 1, further comprising a first dummy metal layer under the third bonding surface of the first die that is disposed at the highest layer of the first dies.

5. The stack package of claim 1, further comprising a second dummy metal layer over the fourth bonding surface of the second die that is disposed at the lowest layer of the second dies.

6. A stack package comprising:

a first die stack including first dies;

a second die stack disposed over the first die stack and including second dies; and an insert die inserted between the first die stack and the second die stack, the insert die being thicker than the first dies and the second dies wherein the insert die comprises:

an insert die body, a dielectric layer covering a surface of the insert die body, through vias, and a dummy metal layer embedded in the dielectric layer, wherein the dummy metal layer extends from a central region in which the through vias are formed toward a side of the insert die body.

7. The stack package of claim 6, wherein:

a first bonding surface of the insert die is directly bonded to a third bonding surface of the first die that is disposed at a highest layer of the first dies, and a second bonding surface of the insert die is directly bonded to a fourth bonding surface of the second die that is disposed at a lowest layer of the second dies.

8. The stack package of claim 6, further comprising a top die that is bonded to the second die stack, the top die being thicker than each of the second dies.

9. The stack package of claim 6, wherein:

the first dies comprise first through vias, and the insert die further comprises second through vias that electrically connect the first through vias to the second dies.

10. The stack package of claim 9, wherein each of the second through vias is longer than each of the first through vias.

11. The stack package of claim 6, wherein bonding surfaces of the second dies that face each other are directly bonded together.

* * * * *